US011946774B2

United States Patent
Einspieler et al.

(10) Patent No.: US 11,946,774 B2
(45) Date of Patent: Apr. 2, 2024

(54) POSITION SENSOR AND METHOD FOR POSITION SENSING AND DIAGNOSTIC

(71) Applicant: ams AG, Premstaetten (AT)

(72) Inventors: Roland Einspieler, Premstaetten (AT); Marcel Urban, Premstaetten (AT); Guenter Kurmies, Premstaetten (AT)

(73) Assignee: AMS AG, Premstaetten (AT)

( * ) Notice: Subject to any disclaimer, the term of this patent is extended or adjusted under 35 U.S.C. 154(b) by 645 days.

(21) Appl. No.: 16/652,845

(22) PCT Filed: Aug. 31, 2018

(86) PCT No.: PCT/EP2018/073499
§ 371 (c)(1),
(2) Date: Apr. 1, 2020

(87) PCT Pub. No.: WO2019/068399
PCT Pub. Date: Apr. 11, 2019

(65) Prior Publication Data
US 2020/0249051 A1 Aug. 6, 2020

(30) Foreign Application Priority Data
Oct. 5, 2017 (EP) .................................. 17195009

(51) Int. Cl.
*G01D 5/14* (2006.01)
*G01D 5/244* (2006.01)
(Continued)

(52) U.S. Cl.
CPC ........... *G01D 5/145* (2013.01); *G01D 5/2449* (2013.01); *G01D 18/001* (2021.05); *G01R 33/07* (2013.01)

(58) Field of Classification Search
CPC ........ G01D 5/142; G01D 5/145; G01D 5/147; G01D 5/16; G01D 5/24471;
(Continued)

(56) References Cited

U.S. PATENT DOCUMENTS 8,368,393 B2 * 2/2013 Zangl ...................... G06F 3/046
324/207.25
9,551,765 B2 1/2017 Röhrer et al.
(Continued)

FOREIGN PATENT DOCUMENTS

CN 102590767 A 7/2012
CN 102680919 A 9/2012
(Continued)

OTHER PUBLICATIONS

Allegro MicroSystems, LLC datasheet "ATS616LSG" 2013.
(Continued)

*Primary Examiner* — David M Schindler
(74) *Attorney, Agent, or Firm* — MH2 TECHNOLOGY LAW GROUP LLP

(57) ABSTRACT

A position sensor comprises at least one magneto-sensitive element, a current source that is coupled to the at least one magneto-sensitive element and is configured to supply a source current to the at least one magneto-sensitive element, an analog-to-digital converter having an input coupled to the at least one magneto-sensitive element, a position calculation unit that is coupled to an output of the analog-to-digital converter and comprises a first output for providing a position signal, and a diagnostic unit that comprises an output coupled to the current source and is configured to provide a stimulus signal as a function of a stimulus pattern at the output of the diagnostic unit.

14 Claims, 8 Drawing Sheets

(51) Int. Cl.
  *G01D 18/00* (2006.01)
  *G01R 33/07* (2006.01)
(58) Field of Classification Search
  CPC .............. G01D 5/24476; G01D 5/2448; G01D
      5/24495; G01D 5/2449; G01D 18/001;
      G01R 33/07; G01R 33/072; G01R
      33/075; G01R 33/077; G01R 33/09;
      G01R 33/091; G01R 33/093; G01R
      33/095; G01R 33/096; G01R 33/098;
      G01R 33/0017; G01R 33/0023; G01R
      33/0029; G01R 33/0035; G01R 33/0041;
      G01B 7/14; G01B 7/30
  See application file for complete search history.

(56) References Cited

U.S. PATENT DOCUMENTS

| | | |
|---|---|---|
| 2003/0225539 A1 | 12/2003 | Motz et al. |
| 2006/0028204 A1* | 2/2006 | Oohira .................. G01D 5/145 |
| | | 324/207.25 |
| 2007/0114988 A1* | 5/2007 | Rossmann ............. G01D 5/142 |
| | | 324/207.2 |
| 2007/0164732 A1 | 7/2007 | Voisine et al. |
| 2007/0279044 A1 | 12/2007 | Rossmann et al. |
| 2011/0133723 A1* | 6/2011 | Forsyth .................. G01D 5/145 |
| | | 324/207.2 |
| 2014/0103921 A1 | 4/2014 | Raman et al. |
| 2014/0182395 A1* | 7/2014 | Brandl .................. G01R 27/08 |
| | | 324/657 |
| 2016/0377663 A1 | 12/2016 | Towne et al. |
| 2017/0248661 A1 | 8/2017 | Blagojevic et al. |
| 2019/0089234 A1* | 3/2019 | Pichler .................. H02K 29/08 |

FOREIGN PATENT DOCUMENTS

| | | |
|---|---|---|
| CN | 103620348 A | 3/2014 |
| CN | 104063674 A | 9/2014 |
| CN | 107121648 A | 9/2017 |
| EP | 3232164 | 10/2017 |
| WO | 98/10302 | 3/1998 |
| WO | 00/54068 | 9/2000 |

OTHER PUBLICATIONS

Allegro MicroSystems, LLC datasheet "ATS642LSH" 2013.
Ams datasheet "AS5247" V1-10 dated Dec. 5, 2016.
Ams datasheet "AS5601" V1-07 dated Sep. 9, 2016.
Amtek datasheet "AM308-Motor Driver ICs" Sep. 2014 V1.0.
Rohm Semiconductor datasheet "5V Singlephase Full-wave Fan Motor Driver BU6909AGFT" Oct. 28, 2014 Rev.002.
European Patent Office, International Search Report for PCT/EP2018/073499 dated Nov. 20, 2018.
Chinese Search Report (with English Translation) in corresponding CN Application No. 2018800636297 dated Jun. 5, 2021, 5 pages.

* cited by examiner

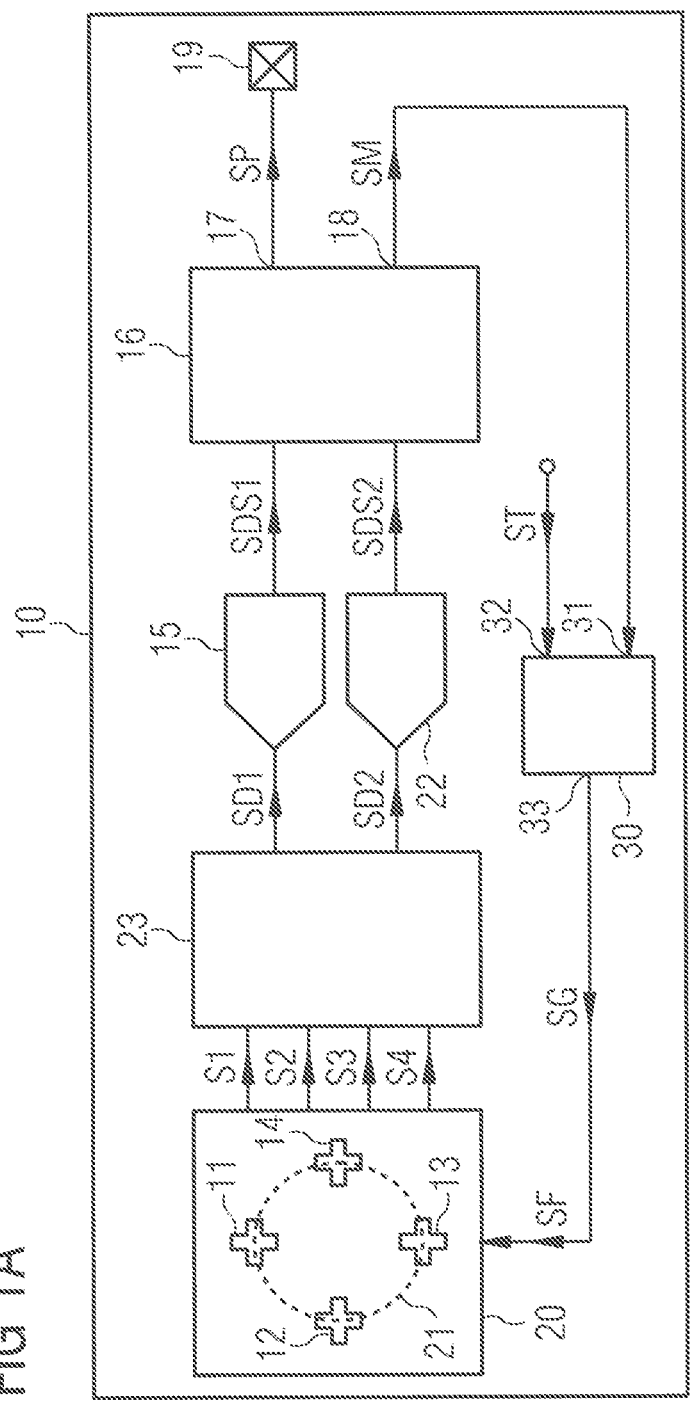

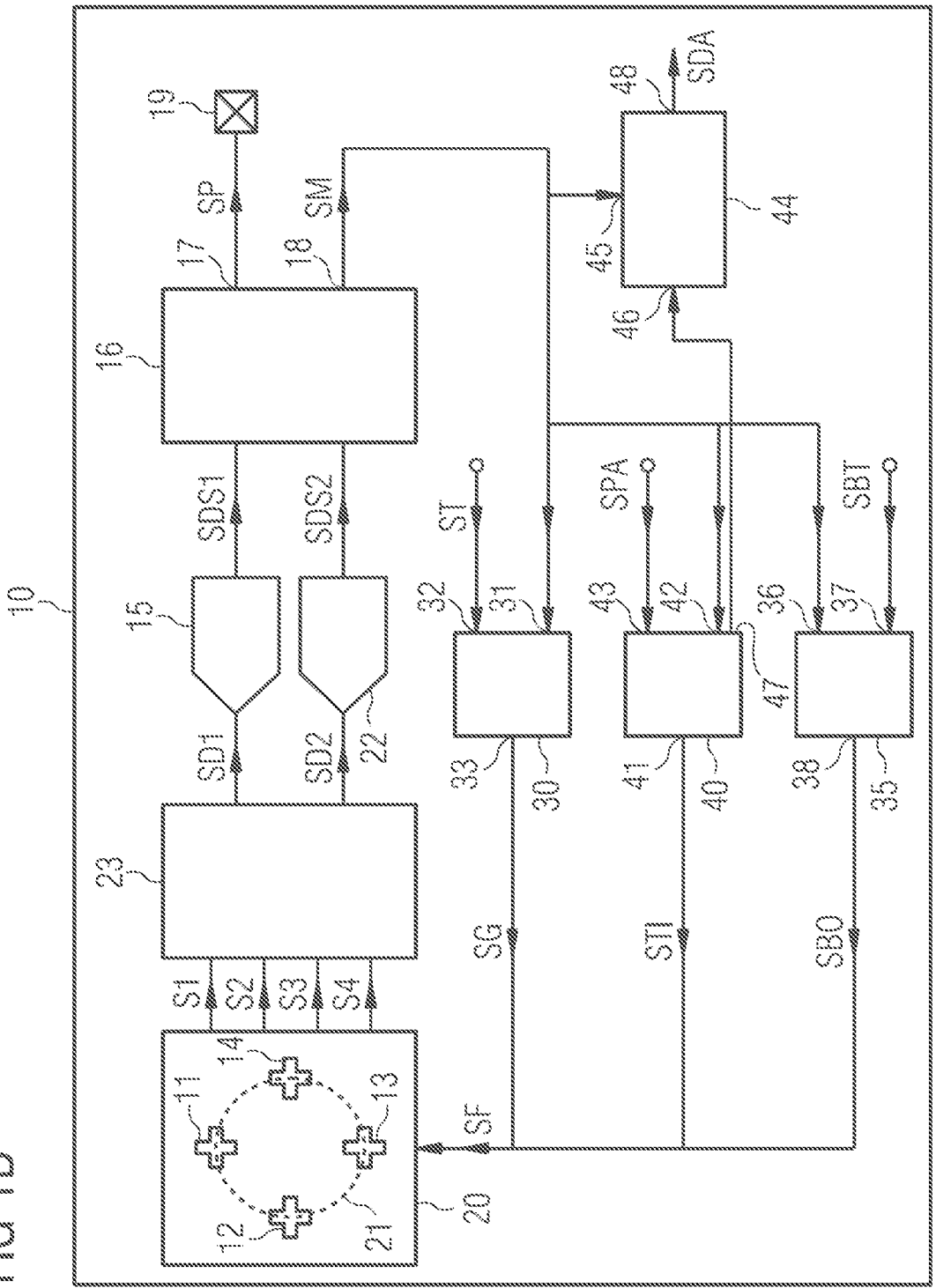

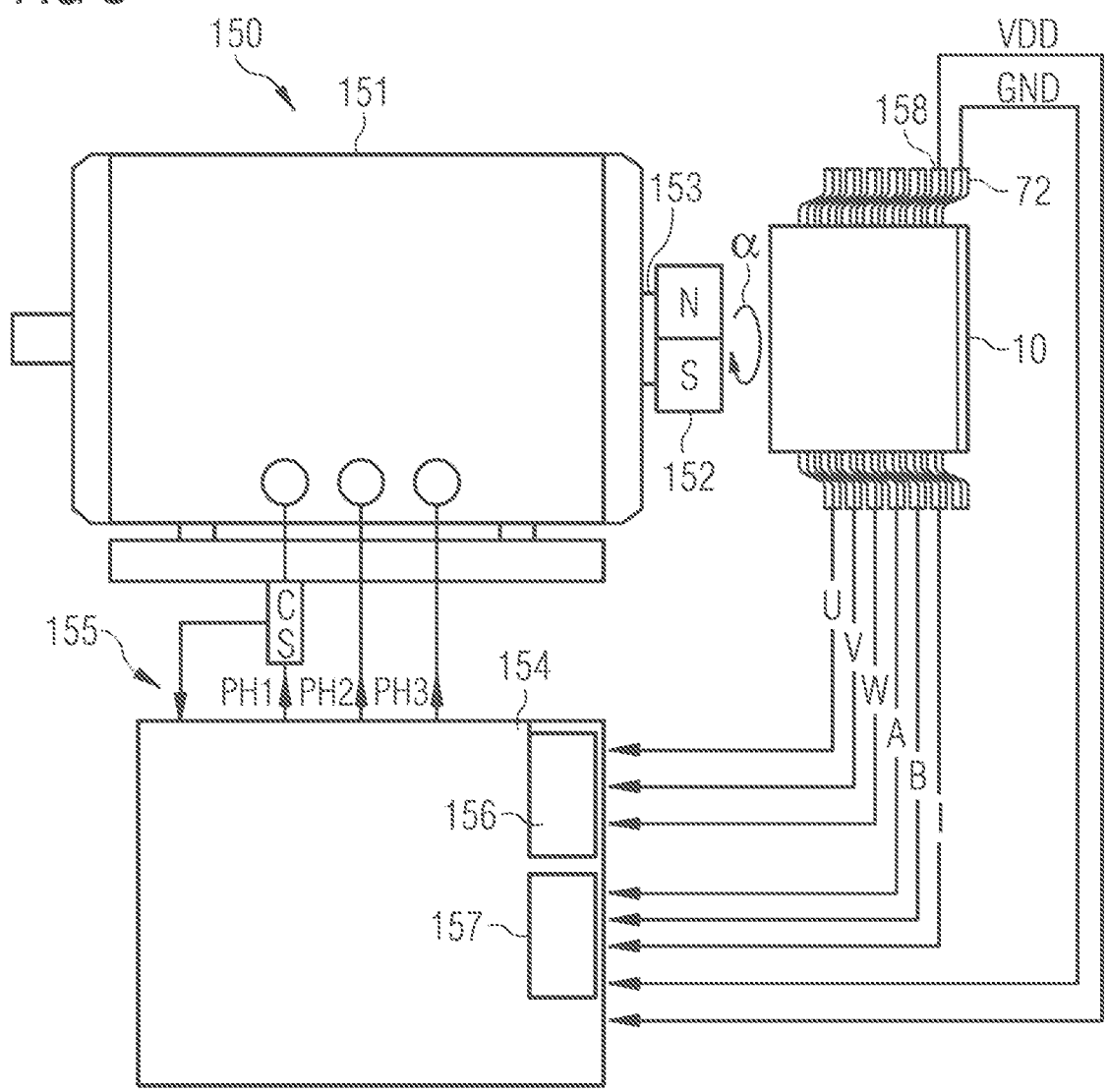

POSITION SENSOR AND METHOD FOR POSITION SENSING AND DIAGNOSTIC

CROSS-REFERENCE TO RELATED APPLICATIONS

The present application is the national stage entry of International Patent Application No. PCT/EP2018/073499, filed on Aug. 31, 2018, which claims the benefit of priority of European Patent Application No. 17195009.0, filed on Oct. 5, 2017, all of which are hereby incorporated by reference in their entirety for all purposes.

BACKGROUND OF THE INVENTION

The present disclosure is related to a position sensor and to a method for position sensing and diagnostic.

A position sensor is often realized as a magnetic position sensor. An arrangement may comprise a magnet and the position sensor. The magnetic field of the magnet is detected by the position sensor. However, a magnetic input field that can be detected by the position sensor may be reduced, for example by aging of the magnet over its lifetime. Thus, the magnetic input field becomes smaller at the place of the position sensor. This may result in a decrease of the accuracy of a position signal generated by the position sensor.

SUMMARY OF THE INVENTION

This disclosure provides a position sensor and a method for position sensing and diagnostic with a self-test.

The definitions as described above also apply to the following description unless otherwise stated.

In an embodiment, a position sensor comprises at least one magneto-sensitive element and a current source that is coupled to the at least one magneto-sensitive element and is configured to supply a source current to the at least one magneto-sensitive element. Moreover, the position sensor comprises an analog-to-digital converter having an input coupled to the at least one magneto-sensitive element and a position calculation unit that is coupled to an output of the analog-to-digital converter and comprises a first output for providing a position signal. Furthermore, the position sensor comprises a diagnostic unit that comprises an output coupled to the current source and is configured to provide a stimulus signal as a function of a stimulus pattern at the output of the diagnostic unit.

In an embodiment, the position calculation unit comprises a second output for providing a magnitude signal.

Advantageously, the source current depends on the stimulus signal. Thus, the influence of the stimulus signal on the position signal and/or on the magnitude signal can be tested. The position sensor performs a self-test. The result of the test can be used to optimize the accuracy of the position sensor. The self-test may be started automatically e.g. with a predetermined frequency.

In an embodiment, the position sensor comprises a comparison unit coupled on its input side to the second output of the position calculation unit. The comparison unit may compare the magnitude signal with the stimulus pattern and may generate a diagnostic signal as a function of the comparison of the magnitude signal and the stimulus pattern. Only when the magnitude signal follows the stimulus pattern, the diagnostic signal indicates a correct operation of the position sensor.

Alternatively, the position sensor comprises the comparison unit coupled on its input side to the first output of the position calculation unit. The comparison unit may compare the position signal with the stimulus pattern and may generate a diagnostic signal as a function of the comparison of the position signal and the stimulus pattern. Only when the position signal follows the stimulus pattern, the diagnostic signal indicates a correct operation of the position sensor. For example in case the position sensor comprises exactly one magneto-sensitive element, an optional magnitude signal may be identical with the position signal. In this case, the second output of the calculation unit and generating the magnitude signal may be omitted. The diagnosis may be based on the position signal.

In an embodiment, the position sensor comprises a gain control unit that is coupled at a first input to the first and/or the second output of the position calculation unit and at an output to the current source. The gain control unit generates a gain control signal at the output of the gain control unit as a function of a comparison of the magnitude signal and/or the position signal with a target signal.

In an embodiment, the source current is a function of the gain control signal. If the magnitude signal and/or the position signal is higher than the target signal, then the source current is decreased. If the magnitude signal and/or the position signal is smaller than the target signal, then the source current is increased. The source current may have a first upper limit. The source current can only be increased by the gain control signal up to the upper limit. Thus, the source current will not be increased above the first upper limit, even if the gain control signal indicates that the magnitude signal is smaller than the target signal.

In an embodiment, the position sensor comprises a boost unit that is coupled at an output to the current source. The boost unit generates a boost signal at the output of the boost unit in case the gain control signal is in a first range and/or the magnitude signal is in a second range and/or the position signal is in a third range. Otherwise, the boost signal is zero. Optionally, other signals such as the boost signal or the stimulus signal may result in an increase of the source current above the first upper limit. The boost unit generates the boost signal with a value higher than zero only if the gain control signal is in the first range and/or the magnitude signal is in the second range and/or the position signal is in the third range; in this case, the magnetic field generated by the magnet is weak.

In an embodiment, the boost unit provides the information whether a magnet field received by the at least one magneto-sensitive element is too weak.

In an embodiment, the position sensor comprises a digital-to-analog converter comprising an input that is coupled to at least one of the output of the gain control unit, the output of the boost unit and the output of the diagnostic unit and comprises an output coupled to the current source.

In an embodiment, the at least one magneto-sensitive element is realized as a Hall element. The source current flows through the Hall element.

In an embodiment, the position sensor comprises an analog frontend circuit. The analog frontend circuit comprises a chopper buffer coupled on its input side to the at least one magneto-sensitive element. Moreover, the analog frontend circuit may comprise a filter coupled on its input side to the output side of the chopper buffer and on its output side to the analog-to-digital converter.

In an embodiment, the position sensor comprises a digital circuit that comprises a chopper unit coupled on its input side to the output side of the analog-to-digital converter and a digital filter coupled on its input side to the output side of the chopper unit and on its output side to the position calculation unit.

In an embodiment, the position sensor comprises an offset compensation unit coupled on its input side to the output side of the analog-to-digital converter and a compensation digital-to-analog converter coupled on its input side to the offset compensation unit and on its output side to the input side of the analog-to-digital converter.

In an embodiment, a method for position sensing and diagnostic comprises providing a source current to at least one magneto-sensitive element, generating at least one analog sensor signal by the at least one magneto-sensitive element, converting the at least one analog sensor signal or a signal derived from the at least one analog sensor signal into a digital sensor signal, calculating a position signal as a function of the digital sensor signal or a signal derived from the digital sensor signal, and controlling the source current as a function of a stimulus signal that is provided as a function of a stimulus pattern.

In an embodiment, a magnitude signal is additionally calculated as a function of the digital sensor signal or the signal derived from the digital sensor signal.

In an embodiment, the magnitude signal and/or the position signal is compared with the stimulus pattern and a diagnostic signal is generated as a function of the comparison of the magnitude signal and/or the position signal and the stimulus pattern. The stimulus pattern is a predetermined pattern. For example, the stimulus pattern is a sequence of at least N values, wherein N may be 2, 3, 4 or an integer number larger than 4. Thus, the position sensor performs steps for diagnostic.

In an embodiment, the magnitude signal and/or the position signal is compared with a target signal and the source current is set as a function of a gain control signal that is a function of the comparison of the magnitude signal and/or the position signal and the target signal. Thus, the position sensor performs steps for position sensing.

In an embodiment, the source current is set as a function of a boost signal in case the gain control signal is in a first range and/or the magnitude signal is in a second range and/or the position signal is in a third range. Thus, the position sensor performs steps for position sensing and/or diagnostic.

In an embodiment, the source current is set as a function of at least of one of the stimulus signal, the gain control signal and the boost signal. The source current may be set by the stimulus signal in a diagnostic phase, by the boost signal in a boost phase and by the gain control signal in an operating phase. The diagnostic phase is a test phase. The position sensor is in a diagnostic mode of operation during the diagnostic phase. The boost phase may be a test phase or an alternative operating phase. Thus, in the operating phase, the position sensor performs steps for position sensing. In the diagnostic phase, the position sensor performs steps for diagnostic. In the boost phase, the position sensor performs steps for diagnostic and/or position sensing.

In an example, in the diagnostic phase, the source current is set as a function of the stimulus signal and of the gain control signal which is constant, wherein the boost signal is zero. In the boost phase, the source current is set as a function of the boost signal and of the gain control signal which is constant, wherein the stimulus signal is zero. The gain control signal may at its upper limit in the boost phase.

In the operating phase, the source current is set as a function of the gain control signal, wherein the boost signal and the stimulus signal are zero.

Thus, the method for position sensing and diagnostic can be named as a method for position sensing with diagnostic or a method for diagnostic of a position sensor or in shorter form as a method for position sensing.

The method for position sensing and diagnostic may be implemented for example by the position sensor according to one of the embodiments defined above.

In an embodiment, the position sensor is implemented as a magnetic position sensor integrated circuit realizing boost automatic-gain-control and diagnostic in a closed loop. Automatic-gain-control can be abbreviated AGC. Thus, the magnetic position sensor is insensitive for magnet aging. A system accuracy is stable over lifetime due even in case of a reduced magnetic input field of the magnet (aging over lifetime). The magnetic input field may decrease over lifetime due to mechanical reasons, temperature cycles etc. However, the output accuracy will not decrease. With the AGC diagnostic boost, the sensor accuracy is independent of the weak magnetic output field.

In an embodiment, the position sensor performs a detection of the magnetic field strength by comparing with a target value (boost target). If the value is below the target signal, a DC current will be added statically (AGC boost). This allows full accuracy without increasing performance of the components in the regulation loop. In addition, a weak magnet can be signalized to a control unit which may be connected to the position sensor. To survey the functionality and performance of the regulation loop, a stimulus pattern will be applied frequently to the AGC boost unit. Output is compared with target pattern to detect misbehavior of the position sensor or of an arrangement with the position sensor.

Advantageously, the position sensor realizes a high functional safety. The position sensor achieves a high Automotive Safety Integrity Level, abbreviated ASIL in safety relevant application. With the AGC boost diagnostic, the magnetic position sensor is using the magnet in the application and verifies the complete closed loop with only one safety mechanism. In addition, the AGC boost diagnostic is also verifying the whole system. If there is a problem with the mechanical arrangement or the magnet, the AGC boost diagnostic detects this problem.

BRIEF DESCRIPTION OF THE DRAWINGS

The following description of figures of embodiments may further illustrate and explain aspects of the position sensor and the method for position sensing and diagnostic. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A to 1D show an embodiment of a position sensor;

FIG. 3 shows an embodiment of an arrangement comprising a motor and a position sensor.

DETAILED DESCRIPTION

Figure 1B:
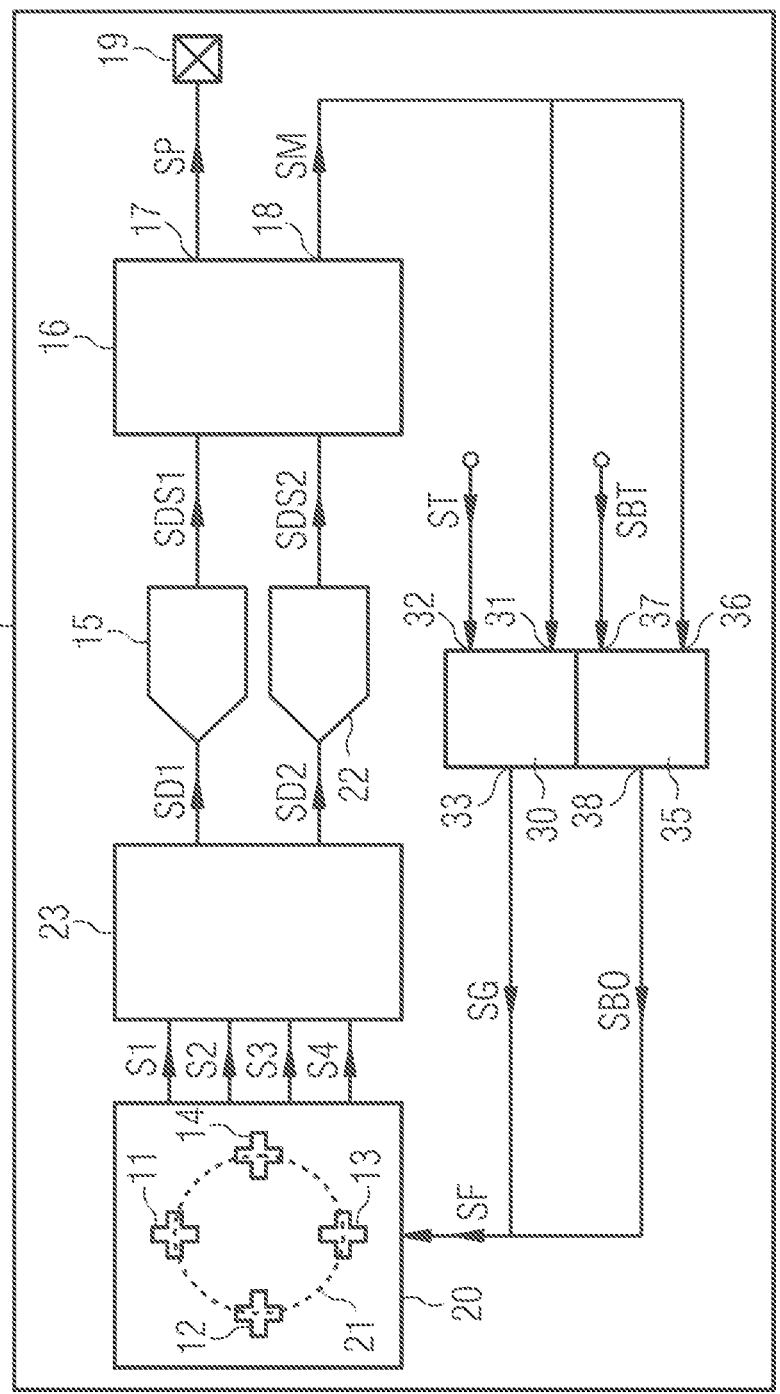

FIG. 1A shows an embodiment of a position sensor 10 that comprises at least one magneto-sensitive element 11, an analog-to-digital converter 15 and a position calculation unit 16. The position sensor 10 is realized as a magnetic position sensor. The analog-to-digital converter 15 can be abbreviated as AD converter. The AD converter 15 is coupled to the at least one magneto-sensitive element 11. The position calculation unit 16 is coupled on its input side to the output side of the AD converter 15. The position calculation unit 16 comprises a first and a second output 17, 18. The first output 17 of the position calculation unit 16 is coupled to a terminal 19 of the position sensor 10. The terminal 19 may be realized as an interface, contact pad or contact pads.

The position sensor 10 may not only comprise the at least one magneto-sensitive element 11 that can be named first magneto-sensitive element, but also a second, a third and a fourth magneto-sensitive element 12 to 14. A sensor array 20 comprises the first to the fourth magneto-sensitive element 11 to 14. The first to the fourth magneto-sensitive elements 11 to 14 are arranged in a regular manner in the sensor array 20. For example, the first to the fourth magneto-sensitive elements 11 to 14 are located on a circle 21. The first to the fourth magneto-sensitive elements 11 to 14 may be located at 0°, 90°, 180° and 270° of the circle 21. The first to the fourth magneto-sensitive element 11 to 14 may be realized as Hall elements. Thus, the sensor array 20 may be implemented as a Hall sensor array.

The position sensor 10 comprises a further analog-to-digital converter 22, abbreviated further AD converter. The further AD converter 22 is coupled on its output side to the input side of the position calculation unit 16. The AD converter 15 and the further AD converter 22 are coupled on their input sides to the sensor array 20. Thus, the two AD converters 15, 22 are coupled on their input sides to the first to the fourth magneto-sensitive element 11 to 14. The position sensor 10 comprises an analog frontend circuit 23 coupling the sensor array 20 to the two AD converters 15, 22. Thus, the analog frontend circuit 23 couples the first to the fourth magneto-sensitive elements 11 to 14 to the AD converter 15 and the further AD converter 22.

Additionally, the position sensor 10 comprises a gain control unit 30 having a first input 31 coupled to the second output 18 of the position calculation unit 18. An output 33 of the gain control unit 30 is connected to an input of the sensor array. Thus, the output 33 of the gain control unit 30 is coupled to the first to the fourth magneto-sensitive elements 11 to 14. The gain control unit 30 may be realized as an automatic gain control unit.

The at least one magneto-sensitive element 11 generates at least one analog sensor signal S1. Thus, the first magneto-sensitive element 11 generates the first analog sensor signal S1. The analog frontend circuit 23 generates a first derived sensor signal SD1 as a function of the at least one analog sensor signal S1. The at least one analog sensor signal S1 is provided to the AD converter 15 via the analog frontend circuit 23. The AD converter 15 converts the first derived sensor signal SD1 into a first digital sensor signal SDS1. The first digital sensor signal SDS1 is provided to the position calculation unit 16.

The position calculation unit 16 generates a position signal SP at the first output 17 of the position calculation unit 16. Additionally, the position calculation unit 16 may generate a magnitude signal SM at the second output 18 of the position calculation unit 16. The position signal SP and the magnitude signal SM are generated as a function of the first digital sensor signal SDS1. The position signal SP and the magnitude signal SM are digital signals.

The magnitude signal SM is provided to the first input 31 of the gain control unit 30. A target signal ST is supplied to a second input 32 of the gain control unit 30. The target signal ST may be implemented as an automatic-gain-control target value. The gain control unit 30 generates a gain control signal SG at the output 33 as a function of a comparison of the magnitude signal SM and the target signal ST. A control signal SF is provided to the sensor array 20 and thus to the at least one magneto-sensitive element 11. The control signal SF is a function of the gain control signal SG. The control signal SF may be equal to the gain control signal SG.

Correspondingly, the second to the fourth magneto-sensitive elements 12 to 14 generate the second to the fourth analog sensor signals S2 to S4. The first to the fourth analog sensor signals S1 to S4 are provided via the analog frontend circuit 23 to the AD converter 15 and the further AD converter 22. The analog frontend circuit 23 receives four signals, namely the first to the fourth analog sensor signals S1 to S4 and generates the first and a second derived signal SD1, SD2 which are provided to the AD converter 15 and to the further AD converter 22. For example, the analog frontend circuit 23 generates the first derived signal SD1 as a function of the first and the third analog sensor signal S1, S3 and the second derived signal SD2 as a function of the second and the fourth sensor signal S2, S4.

The AD converter 15 generates the first digital sensor signal SDS1 as a function of the first derived signal SD1. The further AD converter 22 generates the second digital sensor signal SDS2 as a function of the second derived signal SD2. The first derived sensor signal SD1 and the first digital sensor signal SDS1 may comprise a sine information of the sensor array 20, whereas the second derived sensor signal SD2 and the second digital sensor signal SDS2 may comprise a cosine information of the sensor array 20.

The position calculation unit 16 may be realized as a CORDIC unit or CORDIC calculator. Thus, the position calculation unit 16 generates a position signal SP as a function of the first and the second digital sensor signal SD1, SD2 and thus as a function of the sine and the cosine information generated by the sensor array 20. The position signal SP contains a position information such as e.g. an angle information. The position signal SP is provided to the terminal 19.

The position calculation unit 16 generates the magnitude signal SM as a function of the first and the second digital sensor signal SD1, SD2.

The control signal SF sets a parameter of the sensor array 20 and thus a parameter of the at least one magneto-sensitive element 11. For example, as shown in FIGS. 2B and 2C, the control signal SF sets a value of a source current IS provided to the sensor array 20 and thus to the at least one magneto-sensitive element 11. The source current IS is supplied to the first to the fourth magneto-sensitive elements 11 to 14.

Advantageously, the magnitude signal SM is held on a constant value that is determined by the target signal ST. Thus, a reduction of the magnetic field generated by a not shown magnet is balanced by an amendment of the gain control signal SG and thus of the source current IS. The gain control unit 30 increases the gain control signal SG, when the magnitude signal SM is below the target signal ST; thus, the source current IS is increased. Correspondingly, the gain control unit 30 decreases the gain control signal SG in case the magnitude signal SM is above the target signal ST; thus, the source current IS is decreased.

A semiconductor body, not shown, may comprise the position sensor 10 as shown in FIG. 1A. Thus, the semiconductor body comprises the sensor array 20, the analog frontend circuit 23, the AD converters 15, 22, the position calculation unit 16 and the gain control unit 30 as well as the connection lines between these elements.

The number of magneto-sensitive elements comprised by the position sensor 10 may be 4 as shown in FIG. 1A or 1, 2, 3 or more than 4.

In an alternative, not shown embodiment, the first input 31 of the gain control unit 30 is connected to the first output 17 of the position calculation unit 16. The position signal SP is provided to the first input 31 of the gain control unit 30. The gain control unit 30 generates the gain control signal SG at the output 33 as a function of a comparison of the position signal SP and the target signal ST. Thus, the position signal SP is used instead of the magnitude signal SM. The second output 17 of the position calculation unit 16 may be omitted. This may similarly also be the case in the embodiments of FIGS. 1B to 1D and 2B.

This embodiment may be used if e.g. only one magneto-sensitive element 11 is used. Also in case of two or more magneto-sensitive elements, there may be configurations of the magneto-sensitive elements in which only a position signal SP but not a magnitude signal SM is calculated and the position signal SP is used for the determination of the control signal SF.

FIG. 1B shows an embodiment of the position sensor 10 that is a further development of the embodiment shown in FIG. 1A. The position sensor 10 comprises a boost unit 35 having a first input 36 coupled to the second output 18 of the position calculation unit 16. An output 38 of the boost unit 35 is coupled to the sensor array 20 and thus to the at least one magneto-sensitive element 11.

The magnitude signal SM is provided to the first input 36 of the boost unit 35. A boost target signal SBT is applied to a second input 37 of the boost unit 35. The boost unit 35 compares the magnitude signal SM with the boost target signal SBT and generates a boost signal SBO at the output 38 of the boost unit 35 as a function of the comparison.

The control signal SF is generated as a function of the gain control signal SG and of the boost signal SBO. For example, the control signal SF is the sum of the gain control signal SG and of the boost signal SBO.

The position sensor 10 realizes the steps: If the magnetic input field reduces to boost target, the AGC boost unit 35 increases the sensor current IS in the Hall elements 11 to 14. Thus, the amplitudes of sine cosine signals for angle calculation are corrected. The accuracy on the output that is the position signal SP stays. An information is provided on the output 19 that a magnet is too weak. The information is provided from integrated circuit comprising the position sensor 10 to an electronic control unit (ECU) that controls one or more electrical systems or subsystems in a motor vehicle. Advantageously, no counter measurement in the system are necessary. No additional pre-commutation software in the system is necessary. Boost information is provided to the ECU; thus, a weak magnet is indicated.

In an alternative, not shown embodiment, the first input 36 of the boost unit 35 is connected to the first output 17 of the position calculation unit 16. The position signal SP is provided to the boost unit 35. The boost unit 35 compares the position signal SP with the boost target signal SBT and generates the boost signal SBO at the output 38 of the boost unit 35 as a function of the comparison. Thus, the position signal SP is used instead of the magnitude signal SM. This may similarly also be the case in the embodiments of FIGS. 1D and 2B.

Figure 1C:
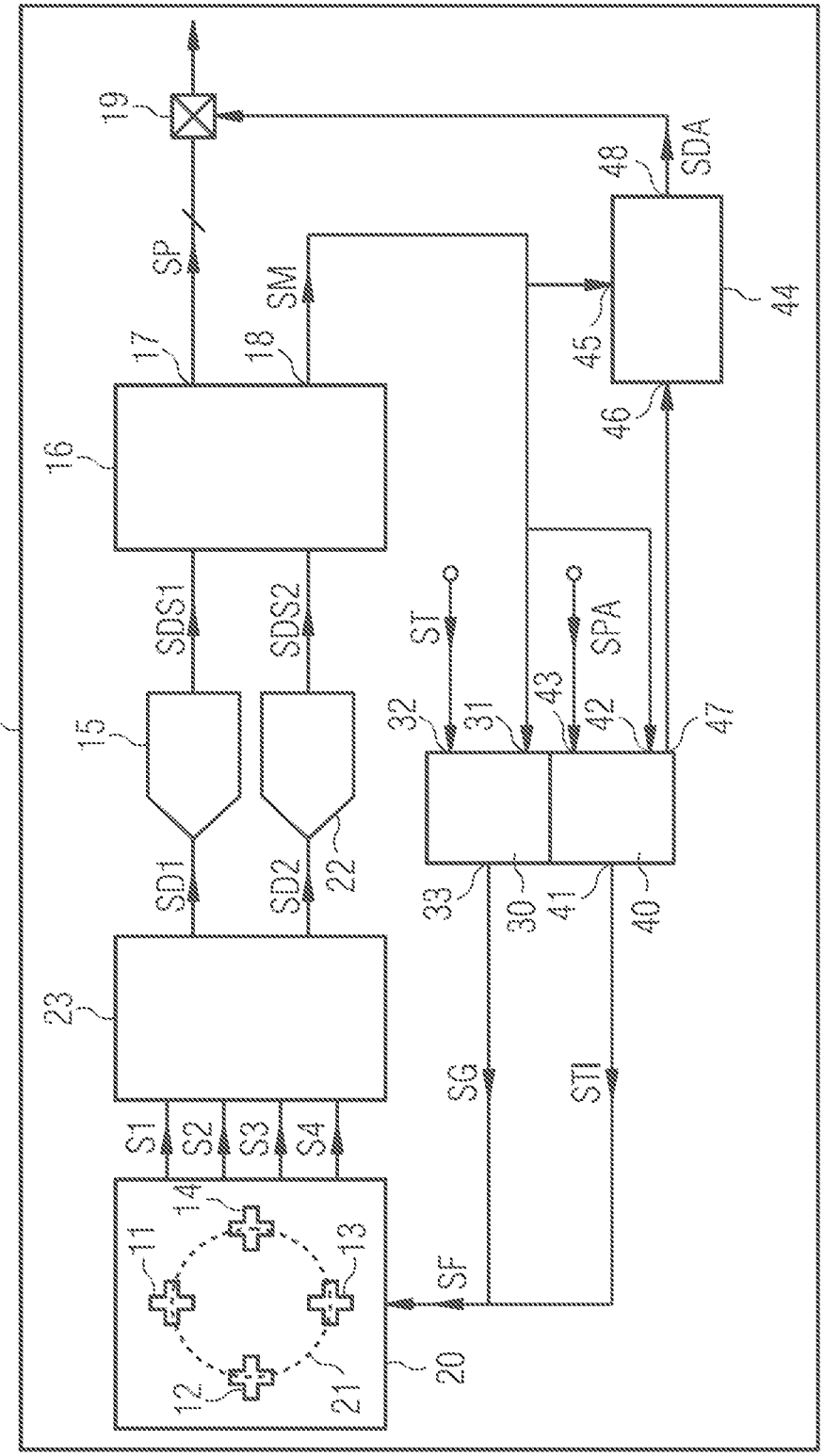

FIG. 1C shows a further embodiment of the position sensor 10 that is a further development of the embodiments shown in FIGS. 1A and 1B. The position sensor 10 comprises a diagnostic unit 40. The diagnostic unit 40 comprises an output 41 that is coupled to the sensor array 20 and thus to the at least one magneto-sensitive element 11. The diagnostic unit 40 comprises a first input 42 coupled to the second output 18 of the position calculation unit 16.

Additionally, the position sensor 10 comprises a comparison unit 44 having a first input 45 coupled to the second output 18 of the position calculation unit 16. A second input 46 of the comparison unit 44 is coupled to a further output 47 of the diagnostic unit 40. Alternatively, the second input 46 of the comparison unit 44 may be coupled to the output 41 of the diagnostic unit 40.

The diagnostic unit 40 generates a stimulus signal STI at the output 41 of the diagnostic unit 40. A pattern stimulus signal SPA is provided to a second input 43 of the diagnostic unit 40. The diagnostic unit 40 generates the stimulus signal STI as a function of the pattern stimulus signal SPA. The control signal SF is generated as a function of the gain control signal SG and of the stimulus signal STI. For example, the control signal SF is the sum of the gain control signal SG and of the stimulus signal STI. During generation of the stimulus signal STI, the gain control signal SG is kept constant. During this time that may be named diagnostic phase, the stimulus signal STI controls the source current IS applied to the at least one magneto-sensitive element 11.

A control unit 104, shown in FIG. 2B, of the position sensor 10 is able to set the position sensor 10 in a diagnostic mode of operation. In the diagnostic mode of operation, the control unit 104 activates the diagnostic unit 40. The diagnostic unit 40 provides the stimulus signal STI during the diagnostic mode of operation. During the diagnostic mode of operation, the gain control signal SG is constant. For example, the gain control signal SG has the value of zero.

The magnitude signal SM is provided to the comparison unit 44 via the first input 45. The comparison unit 44 receives information about the stimulus pattern via the connection between the output 41 or the further output 47 of the diagnostic unit 40 and the second input 46 of the control unit 44. For example, the comparison unit 44 receives the pattern stimulus signal SPA, the stimulus signal STI or a signal derived from these two signals via the above-described connection.

The comparison unit 44 generates a diagnostic signal SDA at an output 48 of the comparison unit 44. The diagnostic signal SDA is generated by the comparison unit 44 as a function of a comparison of the stimulus pattern and the magnitude signal SM. In case the magnitude signal SM follows the stimulus pattern, the diagnostic signal SDA has a first logical value. In case there is a difference between the magnitude signal SM and the stimulus pattern, the diagnostic signal SDA has a second logical value. The first logical value indicates that the position sensor 10 is operating correctly, whereas the second logical value indicates that there is an error condition of the position sensor 10. Thus, the comparison unit 44 performs a safety comparison. The position sensor 10 provides the diagnostic signal SDA at the terminal 19. Thus, a control unit in an arrangement that comprises the position sensor 10 receives the diagnostic signal SDA.

The position sensor 10 realizes a reduction of several safety mechanisms to only one mechanism. The position sensor 10 uses the magnetic input field of the magnet as target information. A defined boost pattern changes the sensor current IS in the Hall elements 11 to 14. Due to the changed source current IS, the sine cosine information changes. A calculation of the boost magnitude signal SM shows the same pattern as the defined boost pattern. A comparison of the pattern is performed. Any issue in the loop shows a change between pattern stimulus and boost magnitude SM and is reported by the diagnostic signal SDA. Thus, safety mechanism are reduced to a minimum, resulting in a reduction of IC area and common cause issues. A full check of the Hall array 20, AD converters 15, 22 and the digital part 16 can be performed. A full check of the application can be performed. The diagnostic signal SDA will indicate not only a problem in the integrated circuit but also a problem in the mechanical or magnet.

In an alternative, not shown embodiment, the first input 42 of the diagnostic unit 40 is connected to the first output 17 of the position calculation unit 16. The position signal SP is provided to the diagnostic unit 40. The first input 45 of the comparison unit 44 is connected to the first output 17 of the position calculation unit 16. The position signal SP is provided to the comparison unit 44 via the first input 45. The diagnostic signal SDA is generated by the comparison unit 44 as a function of a comparison of the stimulus pattern and the position signal SP. Thus, the position signal SP is used instead of the magnitude signal SM. This may similarly also be the case in the embodiments of FIGS. 1D and 2B.

FIG. 1D shows a further embodiment of the position sensor 10 that is further development of the embodiments shown in FIGS. 1A to 1C. The position sensor 10 comprises the diagnostic unit 40, the gain control unit 30 and the boost unit 35. The position calculation unit 16, the diagnostic unit 40, the gain control unit 30, the boost unit 35 and the comparison unit 44 may be realized by logic gates, a state machine, a microprocessor or a microcontroller. The operations performed by these units may be realized by software used by the microprocessor or the microcontroller.

Advantageously, the position sensor 10 solves several objects for Hall Effect based angle (position) sensing, since the position sensor 10 compensates for aging of the magnet by adding a DC current and reduces the number of safety mechanism in closed loop configuration. Thus, area, test-time and potential errors during operation are reduced.

Figure 2A:
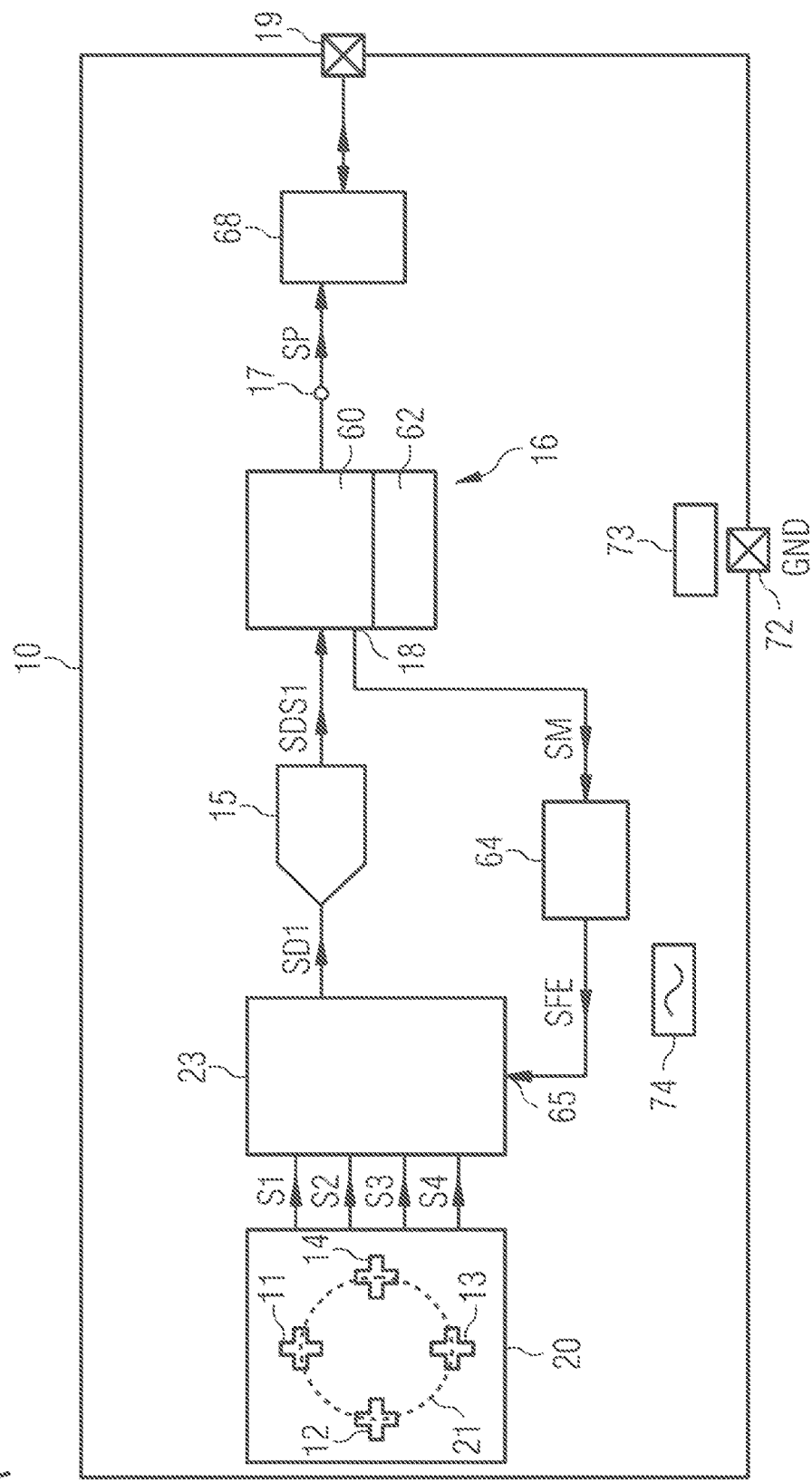
FIGS. 2A to 2C show embodiments of details of a position sensor.
Figure 2B:
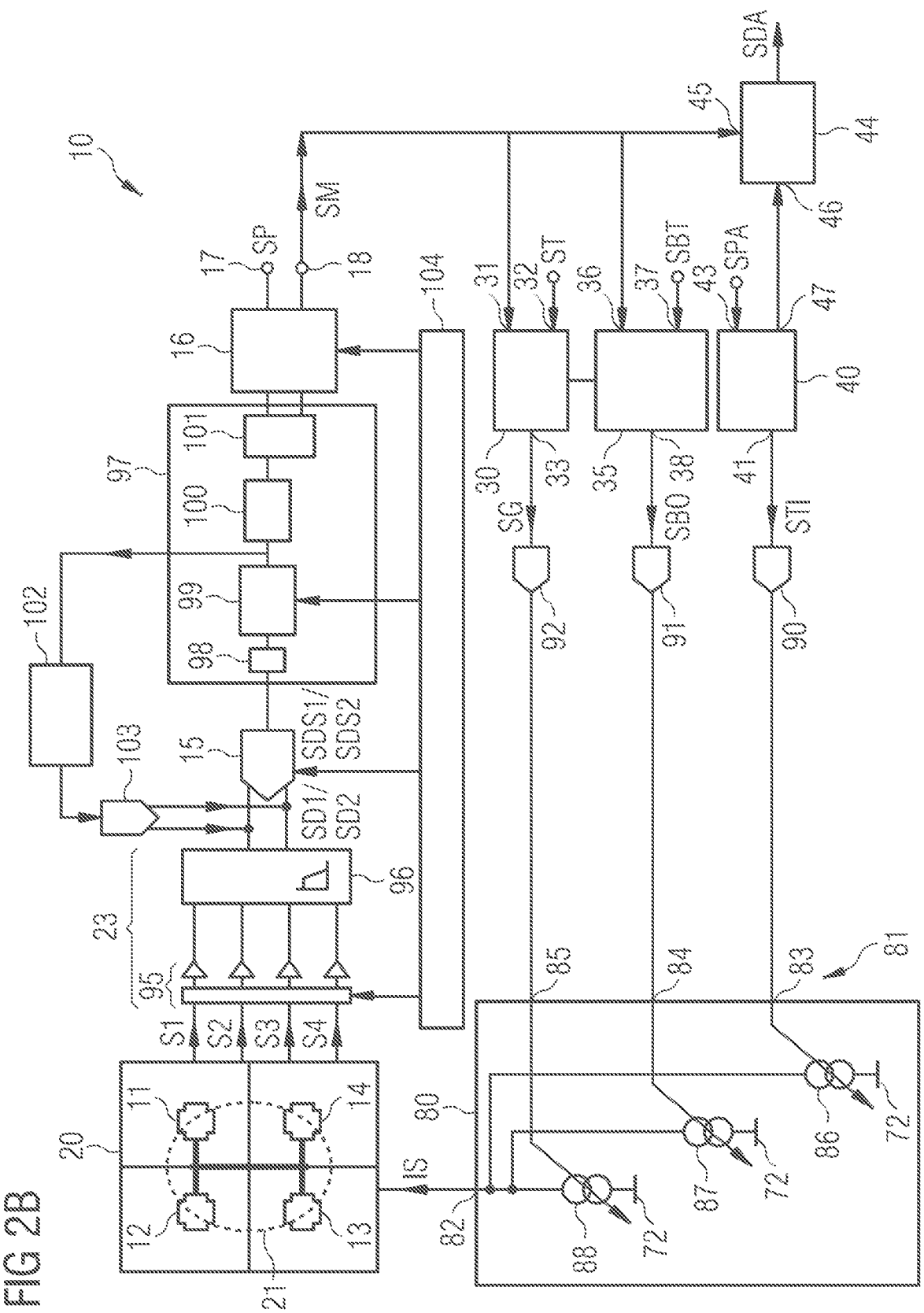
Figure 2C:
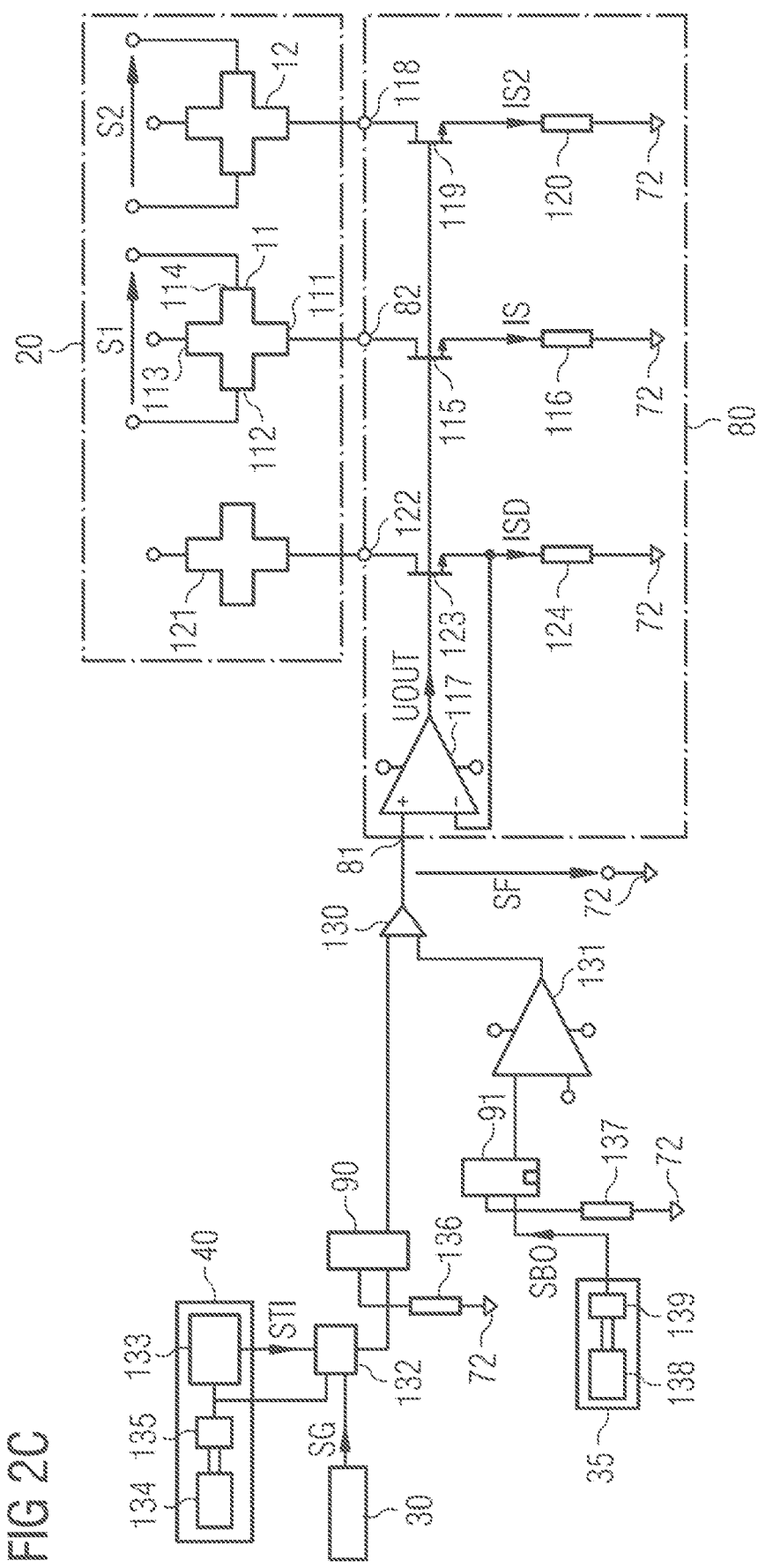

FIG. 2A shows details of the position sensor 10 that is a further development of the embodiments shown in FIGS. 1A to 1D. The position sensor 10 may also comprise the diagnostic unit 40, the gain control unit 30 and/or the boost unit 35 shown in the figures above. The focus of FIG. 2A is the chain between the sensor array 20 and the terminal 19. The AD converter 15 may be realized as a 14 bit analog-to-digital converter. The position calculation unit 16 comprises a digital signal processor 60. The digital signal processor 60 performs the CORDIC calculation. Additionally, the position calculation unit 16 comprises a register setting block 62.

The second output 18 or the first output 17 or another output of the position calculation unit 16 is coupled via an automatic gain control block 64 of the position sensor 10 to a control input 65 of the analog frontend circuit 23. Thus, the magnitude signal SM or the position signal SP or another signal is provided to the automatic gain control block 64. The automatic gain control block 64 generates a feedback signal SFE that is applied to the analog frontend 23. Thus, a weak magnetic field can be compensated by the feedback signal SFE provided to the analog frontend circuit 23 and by the gain control signal SG provided to the current source.

Additionally, the position sensor 10 comprises an output interface 68. The output interface 68 is coupled to the position calculation unit 16 and thus to the digital signal processor 60. The output interface 68 is also coupled to the terminal 19. Thus, the position signal SP can be provided via the output interface 68 to the terminal 19.

Additionally, the position sensor 10 comprises a reference potential terminal 72. A ground potential GND can be tapped at the reference potential terminal 72. The position sensor 10 comprises a high voltage protection circuit 73 coupled to the reference potential terminal 72. Furthermore, the position sensor 10 comprises an oscillator 74.

FIG. 2B shows a further embodiment of the position sensor 10 which is a further development of the embodiments shown in FIGS. 1A to 1D and 2A. The position sensor 10 comprises a current source 80. The current source 80 has a control terminal 81. Moreover, the current source 80 has an output 82 coupled to the at least one magneto-sensitive element 11. Thus, the output 82 of the current source 80 is coupled to the sensor array 20. Therefore, the output 82 of the current source 80 is coupled to the first to the fourth magneto-sensitive element 11 to 14.

The control terminal 81 comprises a first to a third input 83 to 85. Moreover, the current source 80 comprises a first to a third current source circuit 86 to 88. The control terminal 81 of the current source 80 is coupled to control inputs of the first to the third current source circuits 86 to 88. Thus, for example, the first input 83 is connected to the control input of the first current source circuit 86. The second input 84 is connected to the control input of the second current source circuit 87. The third input 85 is connected to the control input of the third current source circuit 88. The first to the third current source circuits 86 to 88 couple the output 82 of the current source 80 to the reference potential terminal 72. Thus, the first to the third current source circuits 86 to 88 are arranged in parallel between the output 82 of the current source 80 and the reference potential terminal 72.

The position sensor 10 comprises a digital-to-analog converter 90, abbreviated as DA converter. The DA converter 90 couples the output 41 of the diagnostic unit 40 to the control terminal 81 of the current source 80. Thus, the DA converter 90 is connected to the first input 83 of the current source 80 and consequently to the control input of the first current source circuit 86. The DA converter 90 has a resolution of at least two bit.

Furthermore, the position sensor 10 comprises a further DA converter 91. The further DA converter 91 couples the output 38 of the boost unit 35 to the control terminal 81 of the current source 80. Thus, the further DA converter 91 couples the output 38 of the boost unit 35 to the second input 84 of the current source 80 and thus to the control input of the second current source circuit 87. The further DA converter 91 has a resolution of at least one bit or of at least two bit.

Additionally, the position sensor 10 comprises an additional DA converter 92 coupling the output 33 of the gain control unit 30 to the control terminal 81 of the current source 80. The DA converter 92 couples the output 33 of the gain control unit 30 to the third input 85 of the current source 80 and thus to the control input of the third current source circuit 88. The additional DA converter 92 has a resolution of at least one bit or of at least two bit.

The analog frontend circuit 23 comprises a chopper buffer 95 coupled on its input side to the at least one magneto-sensitive element 11. Thus, the input side of the chopper buffer 95 is coupled to the sensor array 20. For example, the first to the fourth magneto-sensitive element 11 to 14 are coupled via four connection lines to the input side of the chopper buffer 95. Moreover, the analog frontend circuit 23 comprises a filter 96 coupled on its input side to the output side of the chopper buffer 95. The filter 96 is coupled on its output side to the AD converter 15. The chopper buffer 95 may have four outputs that are connected to the input side of the filter 96. The filter 96 realizes an active load. A corner frequency of the filter 96 may be, for example 100 kHz. The filter 96 may be realized as a low pass filter. The filter 96 may comprise two outputs that are connected to two inputs of the AD converter 15. The AD converter 15 may be realized as a sigma-delta AD converter. The two inputs of the AD converter 15 may be implemented as a first and a second differential input.

The position sensor 10 comprises a digital circuit 97 coupling an output side of the AD converter 15 to an input side of the position calculation unit 16. The digital circuit 97 comprises a chopper unit 98 having an input connected to the output of the AD converter 15. Moreover, the digital circuit 97 comprises a digital filter 99 that is connected on its input side to the output side of the chopper unit 98. The digital filter 99 is coupled on its output side to the input side of the position calculation unit 16. The chopper unit 96 is realized for de-chopping, since the analog sensor signals S1 to S4 are chopped by the chopper buffer 95. The digital filter 99 may be realized as a finite impulse response filter, abbreviated FIR filter. A parameter D of the digital filter 99 may be 100. The digital circuit 97 additionally comprises a further digital filter 100 coupled on its input side to the output side of the digital filter 99. Furthermore, the digital circuit 97 comprises a multiplexer 101 having one input connected to the output of the further digital filter 100 and two outputs connected to two inputs of the position calculation unit 16.

The automatic gain control block 64 comprises an offset compensation unit 102 and a compensation DA converter 103. An input of the offset compensation unit 102 is coupled to the digital circuit 97. For example, the input of the offset compensation unit 102 is connected to the output of the digital filter 99. Therefore, the offset compensation unit 102 is coupled on its input side to the output side of the AD converter 15. An output of the offset compensation unit 102 is coupled via the compensation DA converter 103 to the input side of the AD converter 15. The compensation DA converter 103 has two outputs coupled to the two inputs of the AD converter 15.

Additionally, the position sensor 10 comprises the control unit 104. The control unit 104 is coupled on its output side to the chopper buffer 95, the AD converter 15, the digital filter 99 and the position calculation unit 16. The control unit 104 also has not shown connection lines to the gain control unit 30, the boost unit 35 and the diagnostic unit 40.

The position calculation unit 16 may use the following equations to generate the position signal SP and the magnitude signal SM:

$$\sin \alpha \sim (S1-S3)$$

$$\cos \alpha \sim (S2-S4)$$

$$SP = f(\alpha), \text{ e.g. } SP \sim \alpha$$

$$SM \sim [(S1-S3)^2 + (S2-S4)^2]$$

wherein α is an angle between the position sensor 10 and a magnet. The position signal SP is implemented as an angle signal. The position signal SP represents the angle α of a vector. The magnitude signal SM represents a length of the vector. The magnitude signal SM may e.g. be proportional to the sum of the square of the first digital sensor signal SDS1 and of the square of the second digital sensor signal SDS2. Alternatively, the magnitude signal SM may e.g. be proportional to the sum of the absolute value of the first digital sensor signal SDS1 and of the absolute value of the second digital sensor signal SDS2.

The position sensor 10 comprises the Hall array 20, the AD converter 15, a filter and a calculation of angle value SP and magnitude SM. The position sensor 10 realizes a closed loop approach with AGC control and controls a base current source 88. Moreover, the position sensor 10 performs an AGC boost control and controls an add-on current source 87 for boost. Additionally, the position sensor 10 implements a boost diagnostic control that controls an add-on current source 86 for boost diagnostic control having a pattern stimulus input. A comparison information SDA for diagnostic is provided on the sensor output.

A magnet 152, such as shown e.g. in FIG. 3, is placed on the Hall array 20. Measuring and calculating out of the position and distance of the magnet results in the angle value SP and the magnitude SM. To get the best performance, the AGC control compares the measured magnitude value with the target 72 value. If there is a difference, the AGC control changes the base current source 88 (increasing or decreasing the source current IS). A closed loop approach with AGC control is performed. The base current source 88 is controlled.

Over lifetime, the magnetic input field may decrease. The calculated magnitude value changes and the AGC control unit 30 tries to increase the current on the base current source 88. To hold the maximum supply current, the AGC Control unit 30 stops at a maximum base current of e.g. 255 LSB. If this is the case, the AGC boost unit 35 adds an additional current source 72 (boost target) and increases the current until the magnitude target is equal to the calculated magnitude information. The overall current-consumption increases, but this is valid over lifetime information over comparison block on the sensor IC output. Thus, the position sensor 10 performs an AGC boost diagnostic control using an add-on current source 86 for boost.

The position sensor 10 is sequentially writing a pattern stimulus into the diagnostic control 40. This increases or decreases according to the pattern the current IS of the Hall elements 11 to 14. The calculated magnitude SM changes according to this pattern. A comparison of the calculated magnitude pattern and the pattern stimulus shows a potential error in the complete loop. If both patterns are showing the same, there is no problem. Information is generated over comparison unit 44 on the output of the position sensor 10. The position sensor 10 performs an AGC boost diagnostic control using the add-on current source 86 for boost diagnostic control and a pattern stimulus.

For example, the gain control signal SG may have 8 bit, the boost signal SBO may have 2 or 3 bit and the stimulus signal STI may have 8 bit.

In an alternative, not shown embodiment, the first input 31 of the gain control unit 30, the first input 36 of the boost unit 35 and the first input 45 of the comparison unit 44 are connected to the first output 17 of the position calculation unit 16. The position signal SP is provided to the first input 31 of the gain control unit 30, the first input 36 of the boost unit 35 and the first input 45 of the comparison unit 44 and is used as described above. The second output 18 for providing a magnitude signals SM may be omitted. FIG. 2C shows further details of an embodiment of the position sensor 10 which is a further development of the above-shown embodiments. The position sensor 10 comprises the current source 80 with the control terminal 81 and the output 82. The control terminal 81 only comprises exactly one input, for example the first input 83. The at least one magneto-sensitive element 11 has a first to a fourth terminal 111 to 114. The first terminal 111 is opposite to the third terminal 113 and the second terminal 112 is opposite to the fourth terminal 114. A source current IS flowing through the output 82 of the current source 80 flows through the first and the third terminal 111, 113. Thus, the first analog sensor signal S1 can be tapped between the second and the fourth terminal 112, 114.

The first analog sensor signal S1 has the form of a voltage. The first analog sensor signal S1 is proportional to the product of the source current IS and a magnetic field. The at least one magneto-sensitive element 11 may be sensitive for the magnetic field perpendicular to the surface of the semiconductor body that comprises the at least one magneto-sensitive element 11.

The current source 80 comprises a first transistor 115 having a control terminal coupled to the control terminal 81 of the current source 80 and a first terminal coupled to the output 82 of the current source 80. A second terminal of the first transistor 115 is coupled to the reference potential terminal 72. A first resistor 116 couples the second terminal of the first transistor 115 to the reference potential terminal 72. The current source 80 comprises an amplifier 117 having a first input coupled to the control terminal 81 of the current source 80. An output of the amplifier 117 is connected to the control terminal of the first transistor 115.

The current source 80 comprises a second output 118 that is connected to the second magneto-sensitive element 12. The second magneto-sensitive element 12 is realized such as the at least one magneto-sensitive element 11. The current source 80 comprises a second transistor 119 having a control terminal connected to the control terminal of the first transistor 115. A first terminal of the second transistor 119 is coupled via the second output 118 to the second magneto-sensitive element 12. A second terminal of the second transistor 119 is coupled to the reference potential terminal 72. Moreover, the current source 80 comprises a second resistor 120 coupling the second terminal of the second transistor 119 to the reference potential terminal 72.

Additionally, the position sensor 10 comprises a dummy magneto-sensitive element 121. The dummy magneto-sensitive element 121 is realized such as the at least one magneto-sensitive element 11. Furthermore, the current source 80 comprises a further output 122 coupled to the dummy magneto-sensitive element 121. Additionally, the current source 80 comprises a further transistor 123 having a control terminal connected to the control terminal of the first transistor 115. A first terminal of the further transistor 123 is connected via the further output 122 to the dummy magneto-sensitive element 121. A second terminal of the further transistor 123 is coupled to the reference potential terminal 72. A further resistor 124 couples the second terminal 123 to the reference potential terminal 72. A second input of the amplifier 117 is connected to a node between the further transistor 123 and the further resistor 124.

The control signal SF is tapped at the control terminal 81. The control signal SF has the form of a voltage. The amplifier 117 sets an output voltage at the output of the amplifier 170 such that a voltage drop across the further resistor 124 is equal to the control signal SF. Since the first and the second magneto-sensitive elements 11, 12 are realized such as the dummy magneto-sensitive element 121, the sizes of the first and the second transistor 115, 119 are equal to the size of the further transistor 123 and the resistance values of the first and the second resistor 115, 120 are equal to the resistance value of the further resistor 124, the source current IS flowing through the output 82 is equal to a second source current IS2 flowing through the second output 118 and a further current ISD flowing through the further output 122. The source current IS is equal to IS=SF/R; wherein R is a resistance value of the first resistor 116.

The position sensor 10 comprises the DA converter 90 and the further DA converter 91. An output of the DA converter 90 and an output of the further DA converter 91 are coupled to the control terminal 81. A summing circuit 130 of the position sensor 10 couples the output of the DA converter 90 and the output of the further DA converter 91 to the control terminal 81. The summing circuit 130 is realized as a summing amplifier. The position sensor 10 comprises a buffer 131 coupling the output of the further DA converter 91 to the summing circuit 130. The position sensor 10 also comprises the gain control unit 30 and the diagnostic unit 40. The position sensor 10 additionally comprises a switch 132 coupled on its input side to the gain control unit 30 and to the diagnostic unit 40 and on its output side to the input of the DA converter 90. Thus, either the gain control unit 30 provides its gain control signal SG or the diagnostic unit 40 provides its target signal ST via the switch 132 to the input of the DA converter 90.

The diagnostic unit 40 comprises a sequence generator 133. The sequence generator 133 contains the information about the simulation pattern. The sequence generator 133 is designed to provide the digital sequence for the DA converter 90 to be realized as a safety mechanism. The sequence generator 133, for example, comprises a memory and/or a state machine. Additionally, the diagnostic unit 40 comprises a setting memory 134. The setting memory 134 may be realized as a one-time programmable memory. The setting memory 134 stores the information whether the position sensor 10 shall set the diagnostic unit 40 as active or inactive. If the diagnostic unit 40 is set as inactive, the position sensor 10 will not use the diagnostic mode of operation. The setting memory 134 is coupled to the sequence generator 133 via a logical gate 135 that may be an AND gate. An output of the logical gate 135 is connected to a further input of the switch 132.

A reference terminal of the DA converter 90 is coupled via a resistor 136 to the reference potential terminal 72. A further resistor 137 couples a reference terminal of the further DA converter 91 to the reference potential terminal 72. Additionally, the position sensor 10 comprises the boost unit 35. The boost unit 35 comprises a boost detection unit 138. The boost detection unit 138 detects whether the gain control signal SG is in a first range or/and the magnitude signal SM is in a second range and/or the position signal SP is in the third range. The first, the second and the third range indicate that the magnetic field received by the at least one magneto-sensitive element 11 is weak. Alternatively, the boost detection unit 138 detects whether the gain control signal SG is above a predetermined value or/and the magnitude signal SM is above another predetermined value. When the gain control signal SG is above the predetermined value or/and the magnitude signal SM is above the other predetermined value, the magnetic field is weak. Only in case of a weak magnetic field, the boost signal SBO is higher than zero. Thus, either the second output 18 of the position control unit 16 or the output 33 of the gain control unit 30 is connected to an input of the boost detection unit 138. The boost detection unit 138 can also be called boost automatic gain control detection unit. The boost detection unit 138 is coupled to the output of the boost unit 35 via a logical gate 139 that may be an AND gate.

As can be seen in FIG. 2C, the stimulus signal STI of the diagnostic unit 40 and the gain control signal SG of the gain control unit 30 are combined by a digital circuit. The combined signal and the boost signal SBO of the boost unit 35 are separately converted from the digital domain into the analog domain and are then added in the analog domain. The thus received analog control signal SF is provided to the control terminal 81 of the current source 80. Advantageously, the DA converter 90 and the further DA converter 91 have to be specified only for conversion of digital signals with a small number of bits into analog signals.

Contrary to that, as shown in FIG. 2B, alternatively, the stimulus signal STI, the gain control signal SG and the boost signal SBO are separately converted from the digital domain into the analog domain and separately converted into three currents which are added to generate the source current IS. Thus, the combination of the different output signals STI, SG, SBO of the three units 30, 35, 40 is performed by the addition of currents.

In an alternative embodiment, not shown, the dummy magneto-sensitive element 121 is omitted. The second input of the amplifier 117 is connected to a node between the first transistor 115 and the first resistor 116.

In an alternative embodiment, not shown, also the boost signal SB is combined with the stimulus signal ST and the gain control signal SG by a digital circuit and the combined digital signal is converted into the analog control signal SF by a single DA converter. Thus, only the DA converter 90 is required and another DA converter such as the further DA converter 91 is not necessary. This can be implemented, for example by selecting a DA converter 90 with the appropriate number of bits.

Thus, the stimulus signal STI, the gain control signal SG and the boost signal SBO can be combined completely in the digital domain or completely in the analog domain or partly in the digital and partly in the analog domain to provide the source current IS.

In an embodiment, not shown, the third and the fourth magneto-sensitive element 13, 14 are realized such as the at least one magneto-sensitive element 11. The current source 80 comprises further outputs coupled to the third and the fourth magneto-sensitive element 13, 14. The current source 80 comprises further transistors and further resistors that are arranged such as the first transistor 115 and the first resistor 116.

In an alternative embodiment, not shown, the position sensor 10 uses the current spinning technique, also named as current rotation method. Thus, the sensor array 20 comprises a first multiplexer coupling the output 82 of the current source 80 to the first to the fourth terminal 111-114, a second multiplexer coupling the reference potential terminal 72 to the first to the fourth terminal 111-114 and a third and a fourth multiplexer coupling the first to the fourth terminal 111-114 to two inputs of the analog frontend circuit 23. Thus, the direction of the current flowing in the at least one magneto-sensitive element 11 rotates between four different directions. The sensor array 20 comprises four multiplexer also for each of the further magneto-sensitive elements 12 to 14.

FIG. 3 shows an embodiment of an arrangement 150 comprising the position sensor 10, a motor 151 and a magnet 152. The motor 151 comprises a rotating shaft 153. The magnet 152 is fixed on one end of the rotating shaft 153. The magnet 152 is held at a short distance from the position sensor 10. The magnet 152 may have a cylindrical shape with one North Pole and one South Pole. The position sensor 10 is configured to detect an angle $\alpha$ of the magnet 152 and thus an angle of the rotating shaft 153.

Additionally, the arrangement 150 comprises a motor controller 154 coupling an output side of the position sensor 10 to an input side of the motor 151. The motor controller 154 may be realized as a universal motor controller. The motor controller 154 is connected via three connection lines to the motor 151. A circuit block 155 is arranged in one of the three connection lines with at a further output connected to the motor controller 154.

The motor controller 154 provides phase signals PH1, PH2, PH3 to the motor 151. The phase signals PH1, PH2, PH3 are provided to the not shown windings of the motor 151 such that the rotating shaft 153 is at the angle determined by the phase signals PH1, PH2, PH3. The position sensor 10 detects the angle $\alpha$ and provides the position signal SP in the form of absolute signals U V W. The absolute signals U V W are applied to an absolute interface 156 of the motor controller 154. Additionally, the position sensor 10 generates incremental signals A G I as a function of the position signal SP and provides it to an incremental interface 157 of the motor controller 154. A supply voltage terminal 158 and the reference potential terminal 72 of the position sensor 10 are connected to two terminals of the motor controller 154. The position sensor 10 is housed in a dual inline package. A supply voltage VDD is tapped at the supply voltage terminal 158.

In FIG. 3, the position sensor 10 is configured as a motor control sensor. The position sensor 10, the mechanic and the magnet 152 will be programmed (alignment) in the production line. However, the magnetic input field may decrease over life time. The position sensor 10 maintains a high accuracy of the position signal SP. An increased angle error is avoided. The high accuracy provides a correct commutation in the motor application, a low torque ripple and low acoustic noise in a car.

The invention claimed is:

1. A position sensor comprising:
at least one magneto-sensitive element;
a current source that is coupled to the at least one magneto-sensitive element and is configured to supply a source current to the at least one magneto-sensitive element;
an analog-to-digital converter having an input coupled to the at least one magneto-sensitive element;
a position calculation unit that is coupled to an output of the analog-to-digital converter and comprises a first output for providing a position signal; and
a diagnostic unit that comprises an output coupled to the current source and is configured to provide a stimulus signal as a function of a stimulus pattern at the output of the diagnostic unit,
wherein the stimulus pattern is a predetermined pattern and wherein the diagnostic unit is configured to control the source current during a diagnostic phase, the diagnostic phase being a test phase,
a gain control unit that is coupled at a first input to the position calculation unit and at an output to the current source and is configured to generate a gain control signal at the output of the gain control unit as a function of a comparison of a magnitude signal provided at a second output of the position calculation unit and/or the position signal with a target signal, wherein the gain control unit is configured to set the source current during an operating phase for position sensing.

2. The position sensor according to claim 1, wherein the stimulus pattern is a sequence of at least N values, with N being 2, 3, 4 or an integer number larger than 4.

3. The position sensor according to claim 1, further comprising a comparison unit coupled on its input side to the position calculation unit and being configured to compare the magnitude signal provided at a second output of the position calculation unit and/or the position signal with the stimulus pattern and to generate a diagnostic signal as a function of the comparison of the magnitude signal and/or the position signal and the stimulus pattern.

4. The position sensor according to claim 1, further comprising a boost unit that comprises an output coupled to the current source and is configured to generate a boost signal at the output of the boost unit, wherein the boost unit configured to detect whether the gain control signal is above a predetermined value and/or the magnitude signal is above another predetermined value, wherein when the gain control signal is above the predetermined value and/or the magnitude signal is above the another predetermined value, a magnetic field received by the at least one magneto-sensitive element is weak compared to a magnetic field at beginning of lifetime, wherein in this case the boost signal is higher than zero and otherwise zero.

5. The position sensor according to claim 4, further comprising a digital-to-analog converter comprising an input that is coupled to at least one of the gain control unit, the boost unit and the diagnostic unit and comprises an output coupled to the current source.

6. The position sensor according to claim 1, wherein the at least one magneto-sensitive element is realized as a Hall element being configured that the source current flows through the Hall element.

7. The position sensor according to claim 1, further comprising an analog frontend circuit that comprises:
 a chopper buffer coupled on its input side to the at least one magneto-sensitive element; and
 a filter coupled on its input side to an output side of the chopper buffer and on its output side to the analog-to-digital converter.

8. The position sensor according to claim 1, further comprising a digital circuit that comprises:
 a chopper unit coupled on its input side to an output side of the analog-to-digital converter; and
 a digital filter coupled on its input side to an output side of the chopper unit and on its output side to the position calculation unit.

9. The position sensor according to claim 1, further comprising:
 an offset compensation unit coupled on its input side to an output side of the analog-to-digital converter; and
 a compensation digital-to-analog converter coupled on its input side to the offset compensation unit and on its output side to an input side of the analog-to-digital converter.

10. The position sensor according to claim 1, wherein the stimulus pattern is a non-constant signal.

11. A method for position sensing and diagnostic comprising:
 providing a source current to at least one magneto-sensitive element;
 generating at least one analog sensor signal by the at least one magneto-sensitive element;
 converting the at least one analog sensor signal or a signal derived from the at least one analog sensor signal into a digital sensor signal;
 calculating a position signal as a function of the digital sensor signal or the signal derived from the digital sensor signal;
 comparing a magnitude signal that is calculated as a function of the digital sensor signal or the signal derived from the digital sensor signal and/or the position signal with a target signal;
 controlling the source current as a function of a stimulus signal that is provided as a function of a stimulus pattern,
 wherein the stimulus pattern is a predetermined pattern and wherein the controlling is performed during a diagnostic phase;
 setting the source current as a function of a gain control signal that is a function of the comparison of the magnitude signal and/or the position signal and the target signal, wherein the setting is performed during an operating phase for position sensing.

12. The method according to claim 11, wherein the stimulus pattern is a sequence of at least N values, with N being 2, 3, 4 or an integer number larger than 4.

13. The method according to claim 11,
 wherein the magnitude signal and/or the position signal is compared with the stimulus pattern, and
 wherein a diagnostic signal is generated as a function of the comparison of the magnitude signal and/or the position signal with the stimulus pattern.

14. The method according claim 11, wherein the source current is set as a function of a boost signal in case the gain control signal is above a predetermined value and/or the magnitude signal is above another predetermined value, wherein when the gain control signal is above the predetermined value and/or the magnitude signal is above the another predetermined value, a magnetic field received by the at least one magneto-sensitive element is weak compared to a magnetic field at beginning of lifetime, wherein in this case the boost signal is higher than zero and otherwise zero.

* * * * *